(12) United States Patent
Yoneda

(10) Patent No.: US 10,440,854 B2
(45) Date of Patent: Oct. 8, 2019

(54) SLIDE RAIL UNIT

(71) Applicant: NEC Corporation, Minato-ku, Tokyo (JP)

(72) Inventor: Noriyoshi Yoneda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/917,972

(22) Filed: Mar. 12, 2018

(65) Prior Publication Data

US 2018/0288897 A1    Oct. 4, 2018

(30) Foreign Application Priority Data

Mar. 30, 2017    (JP) ................ 2017-067474

(51) Int. Cl.
| | |
|---|---|
| *H05K 7/18* | (2006.01) |
| *A47B 88/57* | (2017.01) |
| *F16C 29/02* | (2006.01) |
| *H05K 7/14* | (2006.01) |
| *F16C 29/10* | (2006.01) |

(Continued)

(52) U.S. Cl.
CPC ............. *H05K 7/183* (2013.01); *A47B 88/57* (2017.01); *F16C 29/02* (2013.01); *F16C 29/10* (2013.01); *H05K 7/1401* (2013.01); *H05K 7/1489* (2013.01); *A47B 88/423* (2017.01);

(Continued)

(58) Field of Classification Search
CPC .... H05K 7/183; H05K 7/1401; H05K 7/1489; F16C 29/10; A47B 88/57; A47B 88/16; A47B 88/423; A47B 88/0418; A47B 88/49; A47B 88/08; A47B 88/407; A47B 88/0407; A47B 88/44; A47B 88/40; A47B 88/443; A47B 88/447; A47B 88/473; A47B 2088/4235; A47B 2088/0444; A47B 2210/0059; A47B 2210/0016; A47B 2210/0018; A47B 2210/0064; A47B 2210/0081

See application file for complete search history.

(56) References Cited

U.S. PATENT DOCUMENTS 5,484,197 A    1/1996   Hansen et al.
5,961,193 A *  10/1999  Hobbs ................. A47B 88/493
                                              312/333

(Continued)

FOREIGN PATENT DOCUMENTS

DE    102008013903 A1 *  9/2009    ............. F16C 29/02
JP    2001-190347 A       7/2001

(Continued)

OTHER PUBLICATIONS

Japanese Office Action for JP Application No. 2017-067474 dated Oct. 2, 2018 with English Translation.

(Continued)

*Primary Examiner* — Andrew M Roersma

(57) ABSTRACT

A slide rail unit includes: an outer rail; a middle rail housed in the outer rail, being slidable in a longitudinal direction of the outer rail; an inner rail housed in the middle rail, being slidable in a longitudinal direction of the middle rail; and a lever disposed between the outer rail and the middle rail, being slidable in the longitudinal direction of the outer rail. The lever includes a lever projecting portion configured to lock a slide of the middle rail when the lever is drawn out by a predetermined distance.

13 Claims, 7 Drawing Sheets

(51) Int. Cl.
*A47B 88/49* (2017.01)
*A47B 88/42* (2017.01)
*A47B 88/423* (2017.01)

(52) U.S. Cl.
CPC ....... *A47B 88/49* (2017.01); *A47B 2088/4235* (2017.01); *A47B 2210/0059* (2013.01); *F16C 2314/72* (2013.01)

(56) References Cited

U.S. PATENT DOCUMENTS

| | | | | |
|---|---|---|---|---|
| 6,883,885 | B2 * | 4/2005 | Judge | H05K 7/1421 |
| | | | | 312/333 |
| 6,926,377 | B2 * | 8/2005 | Lammens | A47B 88/49 |
| | | | | 312/333 |
| 2012/0308297 | A1 * | 12/2012 | Chen | A47B 88/49 |
| | | | | 403/109.2 |
| 2015/0208802 | A1 | 7/2015 | Yoneda | |
| 2016/0262538 | A1 * | 9/2016 | Chen | H05K 7/1489 |
| 2016/0296017 | A1 * | 10/2016 | Chen | A47B 88/49 |
| 2017/0082143 | A1 * | 3/2017 | Chen | F16C 29/12 |

FOREIGN PATENT DOCUMENTS

| | | |
|---|---|---|
| JP | 3138146 U | 12/2007 |
| JP | 3174025 U | 3/2012 |
| JP | 5565854 B2 | 8/2014 |
| JP | 5725219 B2 | 5/2015 |

OTHER PUBLICATIONS

Japanese Office Action for JP Application No. 2017-067474 dated Apr. 3, 2018 with English Translation.

* cited by examiner

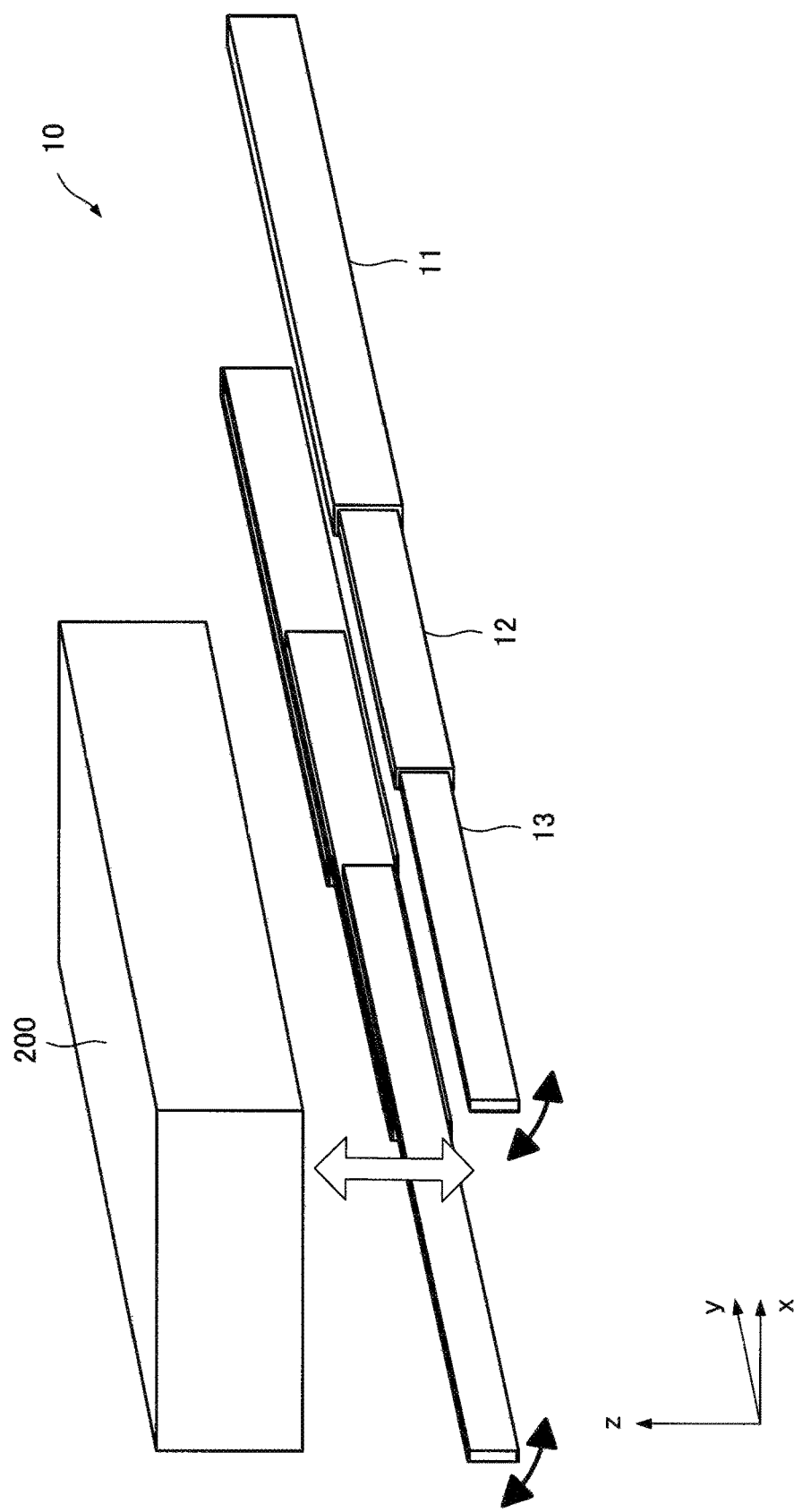

SLIDE RAIL UNIT

This application is based upon and claims the benefit of priority from Japanese patent application No. 2017-067474, filed on Mar. 30, 2017, the disclosure of which is incorporated here in its entirety by reference.

TECHNICAL FIELD

The invention relates to a slide rail unit.

BACKGROUND ART

An electronic device mounted on a cabinet is fixed to the cabinet by, for example, a slide rail unit. The electronic device fixed to the cabinet by the slide rail unit is maintained, while the electronic device is drawn out without being taken down from the cabinet.

In the slide rail unit which fixes the electronic device to the cabinet, an inner rail is configured to be drawn out from a middle rail after the middle rail is fully stretched so that each rail can slide smoothly.

FIGS. 6 and 7 each shows how to detach an electronic device fixed to a cabinet by a slide rail unit from the cabinet. FIG. 6 is a perspective view showing a method for detaching the electronic device from the cabinet.

A slide rail unit 10 shown in FIG. 6 includes an outer rail 11, a middle rail 12, and an inner rail 13. Herein, a configuration on one side of the slide rail unit will be described for sake of simplicity, but it should be noted that the other side is also configured in a similar manner.

An electronic device 200 shown in FIG. 6 is the electronic device fixed to the cabinet by the slide rail unit 10. The white double-headed arrow shown in FIG. 6 indicates directions in which the electronic device 200 is slidable. In other words, the electronic device 200 is slidable along the y-axis shown in FIG. 6.

FIG. 6 shows a method in which the electronic device 200 is further drawn out in the −y direction so that the electronic device 200 is drawn out together with the inner rail 13.

FIG. 7 is a perspective view showing another method for detaching the electronic device from the cabinet. The white double-headed arrow shown in FIG. 7 indicates directions in which the electronic device 200 is lifted or lowered. In other words, the electronic device 200 is lifted or lowered along the z-axis shown in FIG. 7.

FIG. 7 shows a method in which the electronic device 200 is lifted upward (that is, in the +z direction) so as to be detached from the slide rail unit 10.

However, in a case where an electronic device with a long depth is fixed to the cabinet by the slide rail unit, a large space is required in front of the cabinet to detach the electronic device from the cabinet by the method shown in FIG. 6.

The reason is that it is required to further draw out the electronic device, while the slide rail unit is fully extended. In other words, detaching the electronic device by the method shown in FIG. 6 requires a large space for drawing out the electronic device in front of the cabinet.

Furthermore, detaching the electronic device by the method shown in FIG. 7 requires that the electronic device which is a heavy load is lifted up to a certain height. In a case where the electronic device is re-mounted on the slide rail unit, the slide rail unit which has been drawn shakes to right and left, causing a difficulty in fixing the electronic device.

The black double-headed arrows shown in FIG. 7 indicate directions in which the slide rail unit 10 shakes.

SUMMARY

An exemplary object of the invention is to provide a slide rail unit which enables easy detachment of an attached electronic device with a long depth even in a narrow space.

A slide rail unit according to the invention includes: an outer rail; a middle rail housed in the outer rail, being slidable in a longitudinal direction of the outer rail; an inner rail housed in the middle rail, being slidable in a longitudinal direction of the middle rail; and a lever disposed between the outer rail and the middle rail, being slidable in the longitudinal direction of the outer rail, wherein the lever includes a lever projecting portion configured to lock a slide of the middle rail when the lever is drawn out by a predetermined distance.

BRIEF DESCRIPTION OF THE DRAWINGS

FIG. 7 is a perspective view showing another method for detaching the electronic device from the cabinet.

DESCRIPTION OF EXEMPLARY EMBODIMENT

First Exemplary Embodiment

[Description of Configuration]

Figure 1:
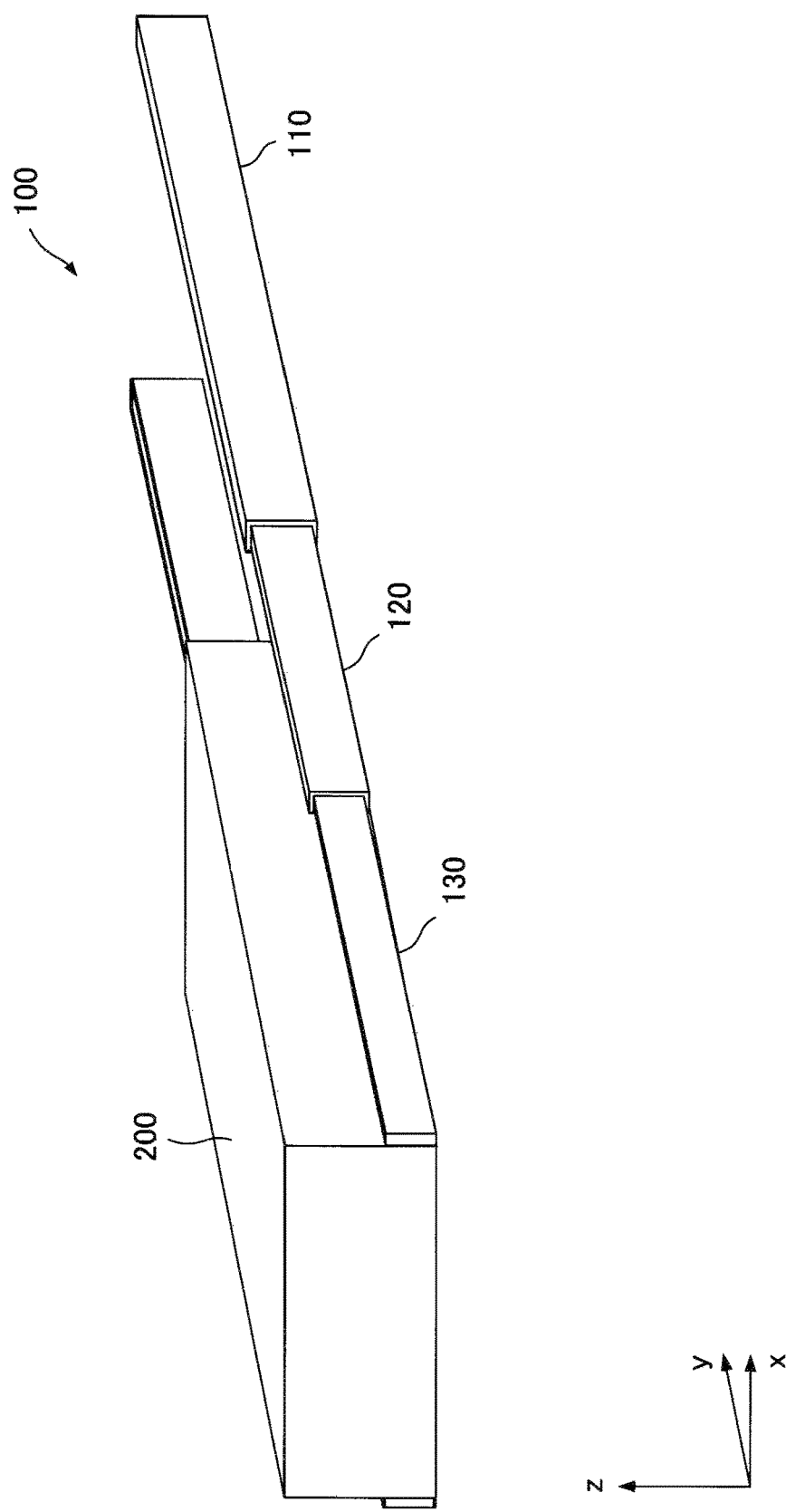
FIG. 1 is a perspective view showing a state where a slide rail unit according to a first exemplary embodiment of the invention is drawn out.

Hereinafter, an exemplary embodiment of the invention will be described with reference to the drawings. FIG. 1 is a perspective view showing an exemplary configuration of a slide rail unit according to a first exemplary embodiment of the invention.

An inner rail of the slide rail unit of this exemplary embodiment is detached before the slide rail unit is extended to the utmost limit by conducting a predetermined work. A worker can conduct the predetermined work in front of the slide rail unit, leading to efficiency in maintenance of the slide rail unit.

As shown in FIG. 1, a slide rail unit 100 includes an outer rail 110, a middle rail 120, and an inner rail 130. The slide rail unit 100 shown in FIG. 1 is in a state where an attached electronic device 200 is drawn out in the −y direction.

As shown in FIG. 1, the electronic device 200 is fixed to the inner rail 130. The outer rail 110 is fixed to a cabinet. Furthermore, the middle rail 120 is attached to the outer rail 110, being slidable inside the outer rail 110.

The inner rail 130 is attached to the middle rail 120, being slidable inside the middle rail 120. The middle rail 120 is configured to be undetachable from the outer rail 110.

The inner rail 130 is configured to be detachable from the middle rail 120. In other words, the inner rail 130 of this exemplary embodiment is to be drawn out of the middle rail 120.

Figure 2:
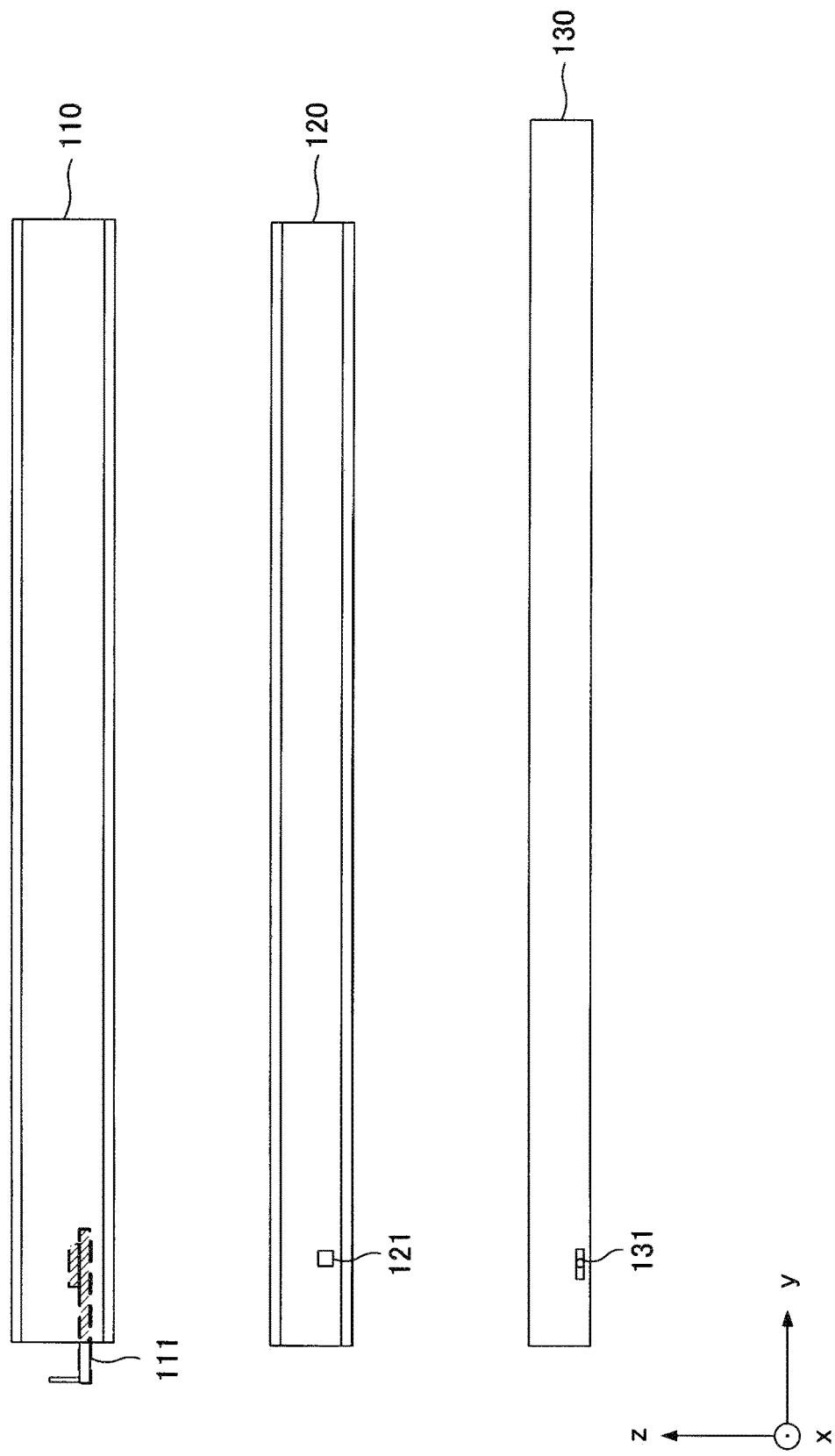
FIG. 2 is a side view showing each rail included in the slide rail unit.

FIG. 2 is a side view showing each rail included in the slide rail unit 100. As shown in FIG. 2, the outer rail 110 has a lock mechanism 111. The middle rail 120 has a locking hole 121. The inner rail 130 has an inner rail locking projection 131.

Figure 3:
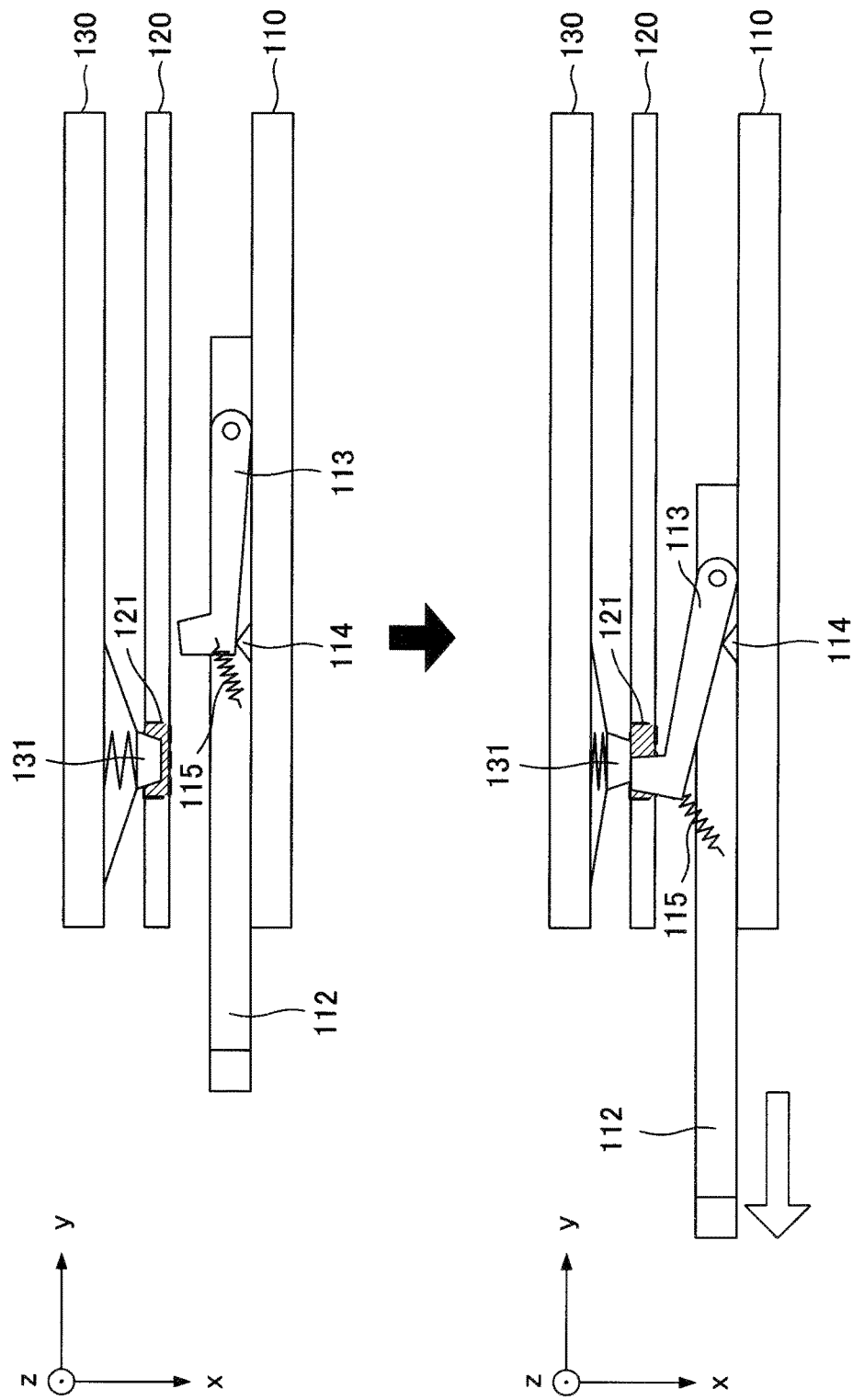
FIG. 3 is a plan view showing components around a lock mechanism.

FIG. 3 is a plan view showing components around the lock mechanism 111. The upper part of FIG. 3 is a plan view showing the components around the lock mechanism 111 when the electronic device 200 is housed in the cabinet.

As shown in the upper part of FIG. 3, the lock mechanism 111 includes an electronic device detachment lever 112, a lock clamp 113, and a spring 115. The electronic device detachment lever 112 is fixed, being slidable back and forth (that is, along the y-axis) with respect to the outer rail 110.

One end of the lock clamp 113 is fixed to the electronic device detachment lever 112, being rotatable with respect to the electronic device detachment lever 112. The other end of the lock clamp 113 is attached to the electronic device detachment lever 112 with the spring 115 involved. The outer rail 110 includes a projection 114 that comes in contact with the lock clamp 113.

The inner rail locking projection 131 of the inner rail 130 changes its height depending on situations whether a spring extends or contracts. When the electronic device 200 is housed in the cabinet, the inner rail locking projection 131 is fitted into the locking hole 121 of the middle rail 120 as shown in the upper part of FIG. 3.

Even in a state where the electronic device 200 is drawn out without being detached, the inner rail locking projection 131 of the inner rail 130 is still fitted into the locking hole 121. In other words, when the electronic device 200 is drawn out, the inner rail 130 and the middle rail 120 integrally slide in the −y direction with respect to the outer rail 110.

When the electronic device 200 is drawn out to a range where the middle rail 120 may not be moved anymore, the middle rail 120 stops moving with respect to the outer rail 110. When the electronic device 200 is further drawn out while the middle rail 120 stops moving, a projecting portion of the inner rail locking projection 131 is inclined so that the inner rail locking projection 131 moves in the −x direction.

In other words, the spring of the inner rail locking projection 131 is pushed back in the −x direction, and the inner rail locking projection 131 comes out of the locking hole 121. After the inner rail locking projection 131 comes out of the locking hole 121, only the inner rail 130 slides in the −y direction.

When detaching the electronic device 200, the worker using the slide rail unit 100 of this exemplary embodiment draws out the electronic device detachment lever 112. The lower part of FIG. 3 is a plan view showing the components around the lock mechanism 111 when the electronic device 200 is detached from the cabinet.

The lower part of FIG. 3 shows the electronic device detachment lever 112 being drawn out. The white arrow shown in the lower part of FIG. 3 indicates a direction in which the electronic device detachment lever 112 is drawn out. As the electronic device detachment lever 112 moves, the lock clamp 113 also moves. While moving, the lock clamp 113 is pushed by the projection 114 and rotates in the −x direction.

As shown in the lower part of FIG. 3, when the lock clamp 113 rotates, a leading end of the lock clamp 113 is fitted into the locking hole 121 of the middle rail 120. In other words, the lock clamp 113 hinders the movement of the middle rail 120 and pushes the inner rail locking projection 131 out of the locking hole 121. Accordingly, connection between the inner rail 130 and the middle rail 120 is unlocked.

Being unlocked, only the inner rail 130 can move. Therefore, the worker can detach the inner rail 130 and the electronic device 200 without drawing out the middle rail 120.

According to the above configuration, when detaching the electronic device 200 from the cabinet, the worker draws out the electronic device detachment lever 112 so that there is no need to extend the slide rail unit 100 to the utmost limit. In other words, the worker can reduce a space in front of the cabinet, compared to a case where the slide rail unit 100 is extended to the utmost limit.

Furthermore, the worker can detach the electronic device in front of the cabinet. In other words, there is no need for the worker to get behind the cabinet to detach the electronic device, leading to efficiency in detachment.

When the electronic device detachment lever 112 is pushed in the +y direction, the lock clamp 113 is not pushed by the projection 114 so that the lock clamp 113 is drawn back by the spring 115 and disengaged from the locking hole 121 of the middle rail 120. In other words, since the middle rail 120 becomes movable again, the worker can draw out the electronic device 200.

[Description of Effect]

In the slide rail unit 100 of this exemplary embodiment, when the electronic device detachment lever 112 is drawn out, the lock mechanism 111 provided on the front side of the outer rail 110 is handled so that the lock clamp 113 is fitted into the locking hole 121 of the middle rail 120.

When the lock clamp 113 is fitted into the locking hole 121, the middle rail 120 is locked in the outer rail 110, and the inner rail 130 is unlocked from the middle rail 120 so that only the inner rail 130 becomes movable. In other words, the worker can detach the electronic device 200 in a narrow space.

Second Exemplary Embodiment

[Description of Configuration]

Figure 4:
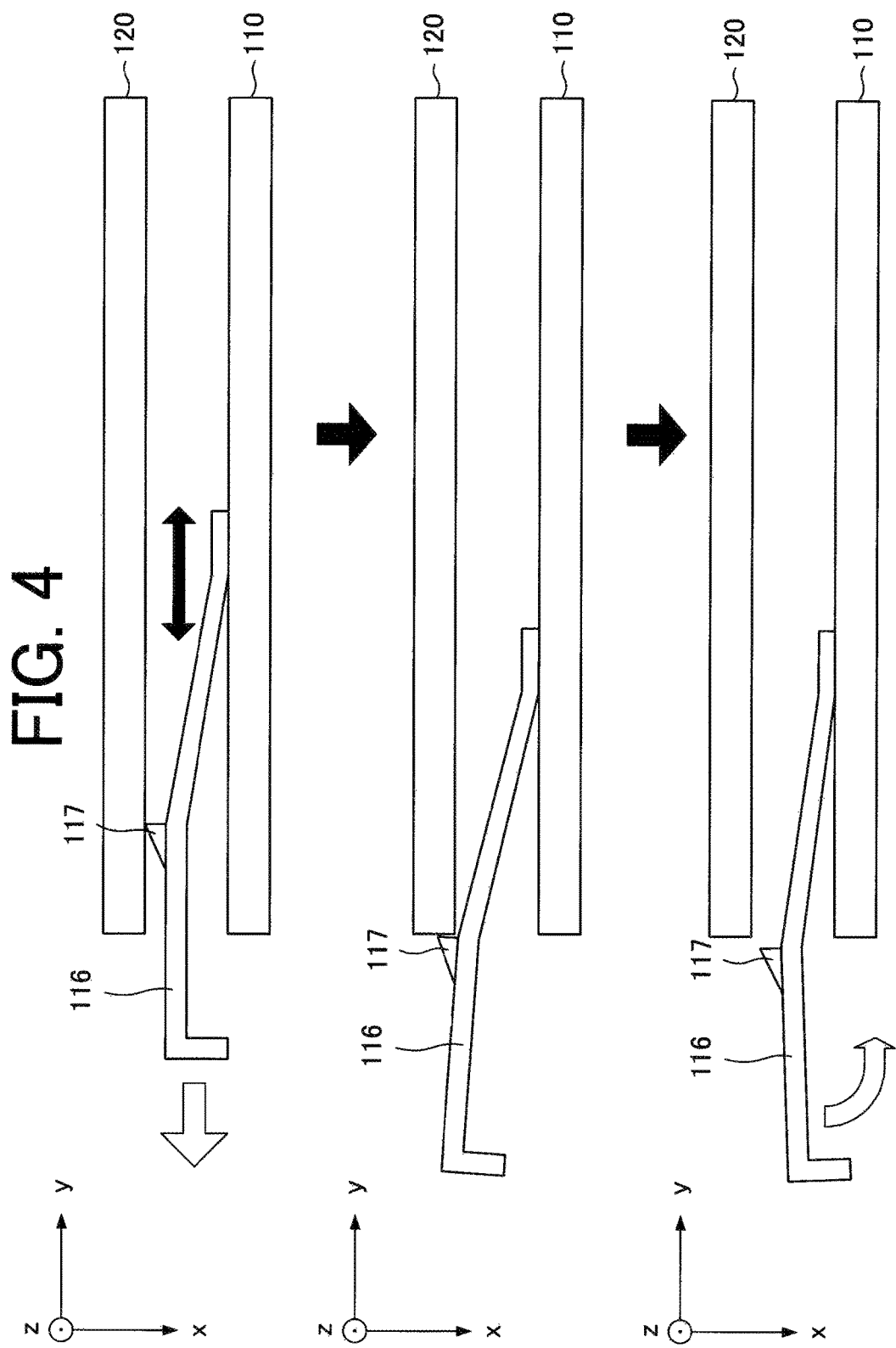
FIG. 4 is a plan view showing an outer rail and a middle rail according to a second exemplary embodiment.

Hereinafter, a second exemplary embodiment of the invention will be described with reference to the drawings. FIG. 4 is a plan view showing an outer rail and a middle rail according to the second exemplary embodiment.

As shown in FIG. 4, an outer rail 110 of this exemplary embodiment has a leaf spring 116 slidable with respect to the outer rail 110.

As similar to the middle rail 120 of the first exemplary embodiment, a middle rail 120 of this exemplary embodiment may have a locking hole 121. As similar to the inner rail 130 of the first exemplary embodiment, an inner rail 130 of this exemplary embodiment may have an inner rail locking projection 131.

The double-headed black arrow shown in the upper part of FIG. 4 indicates directions in which the leaf spring 116 is slidable. In other words, the leaf spring 116 is slidable along the y-axis shown in the upper part of FIG. 4. As shown in the upper part of FIG. 4, the leaf spring 116 has a projection 117.

The upper part of FIG. 4 is a plan view showing components around the leaf spring 116 when an electronic device 200 is housed in a cabinet. As shown in the upper part of FIG. 4, the repulsive leaf spring 116 is in contact with the middle rail 120. When detaching the electronic device 200, the leaf spring 116 is drawn out in a direction indicated by the white arrow shown in the upper part of FIG. 4.

The middle part of FIG. 4 is a plan view showing components around the leaf spring 116 when the electronic device 200 is detached from the cabinet. When the leaf spring 116 is drawn out as shown in the middle part of FIG. 4, the projection 117 is caught on a leading end of the middle rail 120.

When the projection 117 is caught on the leading end of the middle rail 120, movement of the middle rail 120 is hindered so that only the inner rail 130 can be drawn out. Therefore, a worker can detach the electronic device 200 in a narrow space.

The lower part of FIG. 4 is a plan view showing the components around the leaf spring 116 when the electronic device 200 is re-housed in the cabinet. When attaching the electronic device 200 to a slide rail unit, the worker pushes the leaf spring 116 in the +x direction so that the projection 117 is released from the leading end of the middle rail 120 as shown in the lower part of FIG. 4. The white arrow shown in the lower part of FIG. 4 indicates a direction in which the leaf spring 116 is pushed.

While the projection 117 is not caught on the leading end of the middle rail 120 as shown in the lower part of FIG. 4, the electronic device 200 is re-housed in the cabinet. When re-drawing the electronic device 200 which is housed in the cabinet, the worker slides the middle rail 120 in the −y direction so as to draw out the electronic device 200.

[Description of Effect]

In the slide rail unit of this exemplary embodiment, when the leaf spring 116 is drawn out, the projection 117 is caught on the leading end of the middle rail 120. As the projection 117 is caught on the leading end of the middle rail 120, the movement of the middle rail 120 is hindered so that only the inner rail 130 can be drawn out. In other words, the worker can detach the electronic device 200 in a narrow space.

Figure 5:
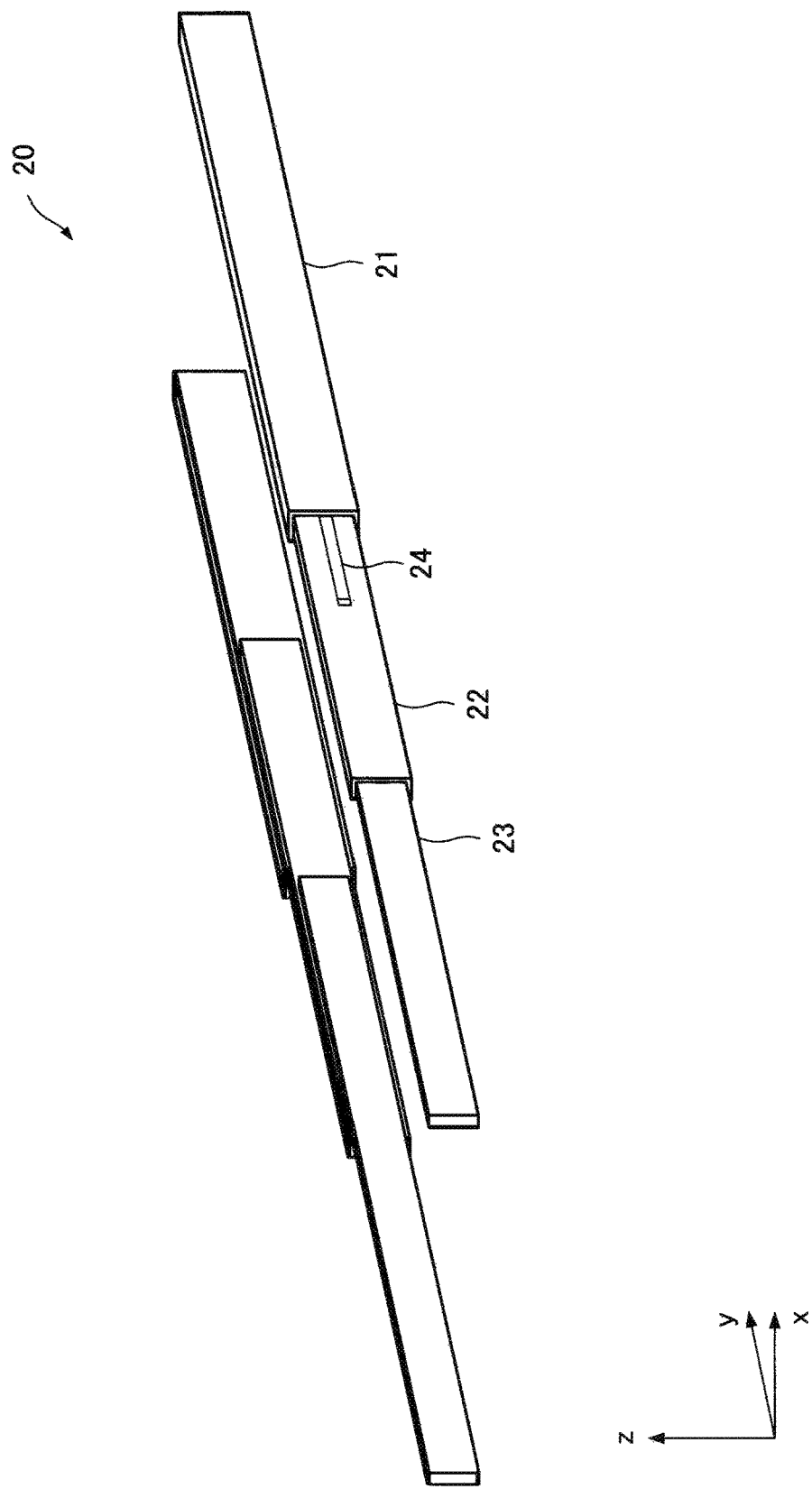
FIG. 5 is a perspective view showing an outline of the slide rail unit according to the invention.

Hereinafter, an outline of the invention will be described. FIG. 5 is a perspective view showing the outline of the slide rail unit according to the invention. The slide rail unit 20 according to the invention includes an outer rail 21 (for example, the outer rail 110); a middle rail 22 (for example, the middle rail 120) housed in the outer rail 21, being slidable in a longitudinal direction of the outer rail 21; an inner rail 23 (for example, the inner rail 130) housed in the middle rail 22, being slidable in a longitudinal direction of the middle rail 22; and a lever 24 disposed between the outer rail 21 and the middle rail 22, being slidable in the longitudinal direction of the outer rail 21 (for example, the electronic device detachment lever 112, and the leaf spring 116). The lever 24 has a lever projecting portion (for example, the projection 117) configured to lock a slide of the middle rail 22 when the lever 24 is drawn out by a predetermined distance.

The slide rail unit with such a configuration enables easy detachment of an attached electronic device with a long depth even in a narrow space.

Furthermore, the middle rail 22 may have a locking hole (for example, a locking hole 121), and the lever projecting portion of the lever 24 drawn out by the predetermined distance may be configured to lock a slide of the middle rail 22 as being caught on the locking hole.

The slide rail unit with such a configuration enables the lever to lock a slide of the middle rail more reliably.

When the lever 24 is pushed back, the lever projecting portion caught on the locking hole may be disengaged from the locking hole.

Such a configuration enables the slide rail unit to easily return to its original state.

Still further, the inner rail 23 may have an inner rail projecting portion (for example, the inner rail locking projection 131) which is to be caught on the locking hole, and as the inner rail projecting portion is caught on the locking hole until the lever 24 is drawn out by the predetermined distance, the middle rail 23 may slide together with the middle rail 22.

Such a configuration ensures a use of the slide rail unit in a narrower space.

Alternatively, the inner rail 23 may slide independently as the lever projecting portion of the lever 24 drawn out by the predetermined distance, instead of the inner rail projecting portion, is caught on the locking hole.

The slide rail unit with such a configuration enables easy detachment of the inner rail.

Still further, the lever projecting portion may be a leading end of a lock clamp (for example, the lock clamp 113) having a rear end fixed to the lever 24. The rear end may be rotatable in a vertical direction with respect to the lever 24. The lock clamp may be connected to the lever 24 by a spring (for example, the spring 115).

The slide rail unit with such a configuration enables the lever to lock a slide of the middle rail more reliably.

Still further, the lever projecting portion of the lever 24 drawn out by the predetermined distance may be configured to lock a slide of the middle rail 22 as being caught on a leading end of the middle rail 22.

The slide rail unit with such a configuration enables the lever with an easier configuration to lock a slide of the middle rail.

Still further, the lever 24 may be a leaf spring (for example, the leaf spring 116).

The slide rail unit with such a configuration enables the lever to lock a slide of the middle rail more reliably.

The above exemplary embodiments may be described in whole or part as the following supplementary notes, but are not limited thereto.

(Supplementary Note 1)

A slide rail unit including: an outer rail; a middle rail housed in the outer rail, being slidable in a longitudinal direction of the outer rail; an inner rail housed in the middle rail, being slidable in a longitudinal direction of the middle rail; and a lever disposed between the outer rail and the middle rail, being slidable in the longitudinal direction of the outer rail, wherein the lever includes a lever projecting portion configured to lock a slide of the middle rail when the lever is drawn out by a predetermined distance.

(Supplementary Note 2)

The slide rail unit according to supplementary note 1, wherein the middle rail has a locking hole, and the lever projecting portion of the lever drawn out by the predetermined distance is configured to lock the slide of the middle rail as being caught on the locking hole.

(Supplementary Note 3)

The slide rail unit according to supplementary note 2, wherein the lever projecting portion caught on the locking hole is disengaged from the locking hole when the lever is pushed back.

(Supplementary Note 4)

The slide rail unit according to supplementary note 2, wherein the inner rail has an inner rail projecting portion which is to be caught on the locking hole, being configured to slide together with the middle rail as the inner rail projecting portion is caught on the locking hole until the lever is drawn out by the predetermined distance.

(Supplementary Note 5)

The slide rail unit according to supplementary note 3, wherein the inner rail has an inner rail projecting portion which is to be caught on the locking hole, being configured to slide together with the middle rail as the inner rail projecting portion is caught on the locking hole until the lever is drawn out by the predetermined distance.

(Supplementary Note 6)

The slide rail unit according to supplementary note 4, wherein the inner rail slides independently as the lever projecting portion of the lever drawn out by the predetermined distance, instead of the inner rail projecting portion, is caught on the locking hole.

(Supplementary Note 7)

The slide rail unit according to supplementary note 5, wherein the inner rail slides independently as the lever projecting portion of the lever drawn out by the predetermined distance, instead of the inner rail projecting portion, is caught on the locking hole.

(Supplementary Note 8)

The slide rail unit according to supplementary note 2, wherein the lever projecting portion is a leading end of a lock clamp having a rear end fixed to the lever.

(Supplementary Note 9)

The slide rail unit according to supplementary note 3, wherein the lever projecting portion is a leading end of a lock clamp having a rear end fixed to the lever.

(Supplementary Note 10)

The slide rail unit according to supplementary note 4, wherein the lever projecting portion is a leading end of a lock clamp having a rear end fixed to the lever.

(Supplementary Note 11)

The slide rail unit according to supplementary note 5, wherein the lever projecting portion is a leading end of a lock clamp having a rear end fixed to the lever.

(Supplementary Note 12)

The slide rail unit according to supplementary note 6, wherein the lever projecting portion is a leading end of a lock clamp having a rear end fixed to the lever.

(Supplementary Note 13)

The slide rail unit according to supplementary note 7, wherein the lever projecting portion is a leading end of a lock clamp having a rear end fixed to the lever.

(Supplementary Note 14)

The slide rail unit according to supplementary note 8, wherein the rear end is rotatable in a vertical direction with respect to the lever.

(Supplementary Note 15)

The slide rail unit according to supplementary note 9, wherein the rear end is rotatable in a vertical direction with respect to the lever.

(Supplementary Note 16)

The slide rail unit according to supplementary note 10, wherein the rear end is rotatable in a vertical direction with respect to the lever.

(Supplementary Note 17)

The slide rail unit according to supplementary note 11, wherein the rear end is rotatable in a vertical direction with respect to the lever.

(Supplementary Note 18)

The slide rail unit according to supplementary note 12, wherein the rear end is rotatable in a vertical direction with respect to the lever.

(Supplementary Note 19)

The slide rail unit according to supplementary note 13, wherein the rear end is rotatable in a vertical direction with respect to the lever.

(Supplementary Note 20)

The slide rail unit according to supplementary note 8, wherein the lock clamp is connected to the lever by a spring.

(Supplementary Note 21)

The slide rail unit according to supplementary note 9, wherein the lock clamp is connected to the lever by a spring.

(Supplementary Note 22)

The slide rail unit according to supplementary note 10, wherein the lock clamp is connected to the lever by a spring.

(Supplementary Note 23)

The slide rail unit according to supplementary note 11, wherein the lock clamp is connected to the lever by a spring.

(Supplementary Note 24)

The slide rail unit according to supplementary note 12, wherein the lock clamp is connected to the lever by a spring.

(Supplementary Note 25)

The slide rail unit according to supplementary note 13, wherein the lock clamp is connected to the lever by a spring.

(Supplementary Note 26)

The slide rail unit according to supplementary note 14, wherein the lock clamp is connected to the lever by a spring.

(Supplementary Note 27)

The slide rail unit according to supplementary note 15, wherein the lock clamp is connected to the lever by a spring.

(Supplementary Note 28)

The slide rail unit according to supplementary note 16, wherein the lock clamp is connected to the lever by a spring.

(Supplementary Note 29)

The slide rail unit according to supplementary note 17, wherein the lock clamp is connected to the lever by a spring.

(Supplementary Note 30)

The slide rail unit according to supplementary note 18, wherein the lock clamp is connected to the lever by a spring.

(Supplementary Note 31)

The slide rail unit according to supplementary note 19, wherein the lock clamp is connected to the lever by a spring.

(Supplementary Note 32)

The slide rail unit according to supplementary note 1, wherein the lever projecting portion of the lever drawn out by the predetermined distance is configured to lock the slide of the middle rail as being caught on a leading end of the middle rail.

(Supplementary Note 33)

The slide rail unit according to supplementary note 32, wherein the lever is a leaf spring.

Japanese Patent No. 5725219 discloses a slide rail unit that enables to reduce a large work space which is required to take out an object from the slide rail unit when installing the object on a cradle with the slide rail unit.

Figure 6:
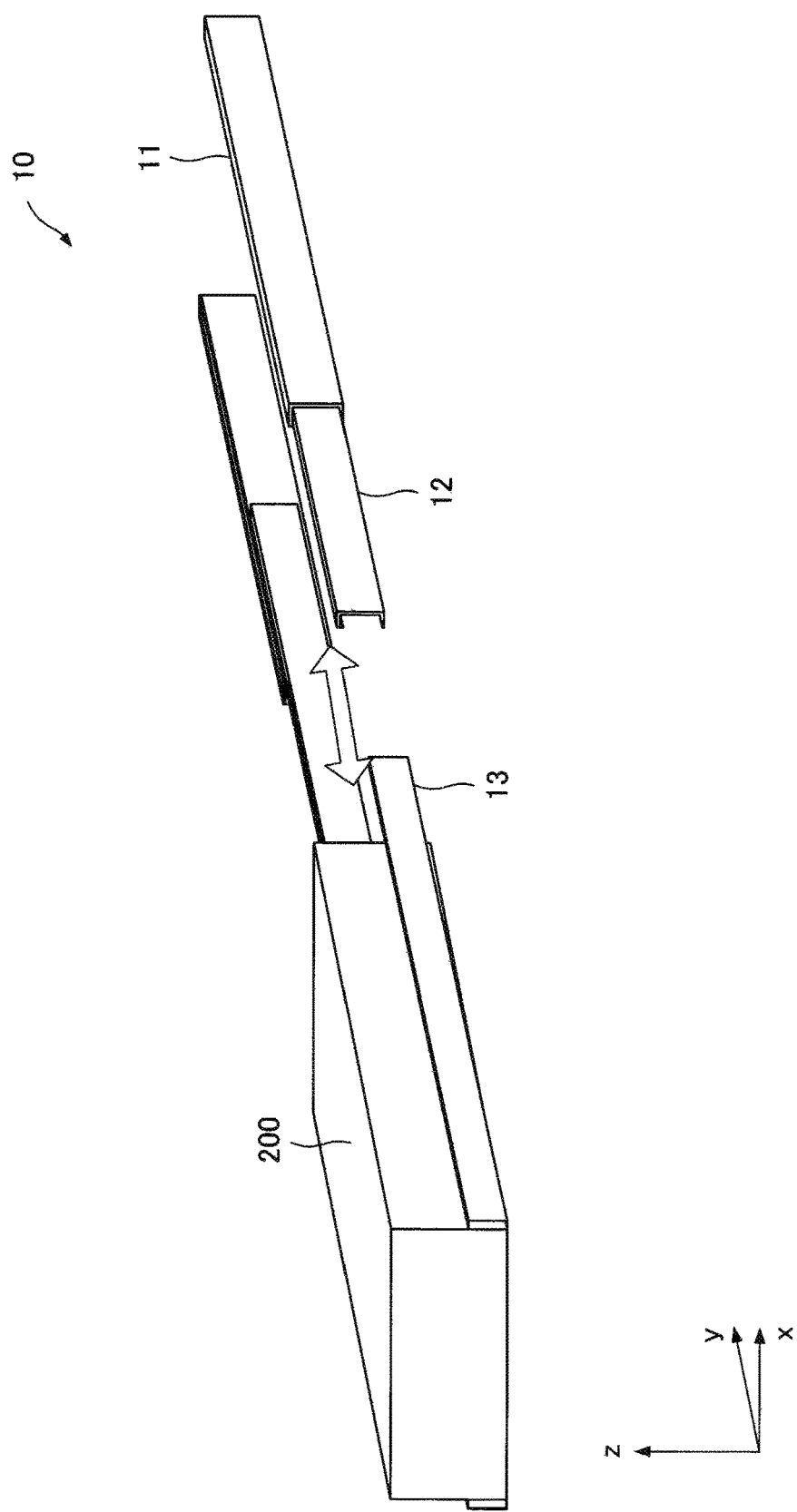
FIG. 6 is a perspective view showing a method for detaching an electronic device from a cabinet.

Using the slide rail unit disclosed in Japanese Patent No. 5725219, when an electronic device is detached from a cabinet by the method shown in FIG. 6, the electronic device is detached without drawing out a middle rail. In other words, the electronic device is detachable from the cabinet even in a narrow space.

However, in the slide rail unit disclosed in Japanese Patent No. 5725219, a lock mechanism that prevents drawing of the middle rail is attached behind the cabinet. In other words, when the electronic device is detached again while the electronic device is being drawn out, a worker is required to get behind the cabinet to lock the middle rail.

Such a work is required each time the electronic device is detached so that using the slide rail unit disclosed in Japanese Patent No. 5725219 decreases work efficiency.

Japanese Patent No. 5565854 discloses a slide rail unit that enables to reduce a work space which is required when detaching a movable rail from an intermediate rail and enables to further improve stability of a cradle.

However, using the slide rail unit disclosed in Japanese Patent No. 5565854 requires attachment of a stopper to a support and the like of a rack cabinet. Therefore, the slide rail unit disclosed in Japanese Patent No. 5565854 is not used when attaching an electronic device to a cabinet to which the stopper may not be attached.

According to the invention, it is possible to easily detach an attached electronic device with a long depth even in a narrow space.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A slide rail unit comprising:
   an outer rail;
   a middle rail housed in the outer rail, being slidable in a longitudinal direction of the outer rail;
   an inner rail housed in the middle rail, being slidable in a longitudinal direction of the middle rail; and
   a lever disposed between the outer rail and the middle rail, being slidable in the longitudinal direction of the outer rail,
   wherein the lever includes a lever projecting portion configured to lock sliding of the middle rail when the lever is drawn out by a predetermined distance,
   the middle rail has a locking hole,
   the lever projecting portion of the lever drawn out by the predetermined distance is configured to lock sliding of the middle rail as being caught on the locking hole,
   the inner rail has an inner rail projecting portion which is to be caught on the locking hole, and
   the inner rail being configured to slide together with the middle rail as the inner rail projecting portion is caught on the locking hole until the lever is drawn out by the predetermined distance.

2. The slide rail unit according to claim 1, wherein the lever projecting portion caught on the locking hole is disengaged from the locking hole when the lever is pushed back.

3. The slide rail unit according to claim 2, wherein the inner rail slides independently as the lever projecting portion of the lever drawn out by the predetermined distance, instead of the inner rail projecting portion, is caught on the locking hole.

4. The slide rail unit according to claim 3, wherein the lever projecting portion is a leading end of a lock clamp having a rear end fixed to the lever.

5. The slide rail unit according to claim 2, wherein the lever projecting portion is a leading end of a lock clamp having a rear end fixed to the lever.

6. The slide rail unit according to claim 5, wherein the lock clamp is rotatable with respect to the lever.

7. The slide rail unit according to claim 1, wherein the inner rail slides independently as the lever projecting portion of the lever drawn out by the predetermined distance, instead of the inner rail projecting portion, is caught on the locking hole.

8. The slide rail unit according to claim 7, wherein the lever projecting portion is a leading end of a lock clamp having a rear end fixed to the lever.

9. The slide rail unit according to claim 1, wherein the lever projecting portion is a leading end of a lock clamp having a rear end fixed to the lever.

10. The slide rail unit according to claim 9, wherein the lock clamp is rotatable with respect to the lever.

11. The slide rail unit according to claim 9, wherein the lock clamp is connected to the lever by a spring.

12. A slide rail unit comprising:
    an outer rail;
    a middle rail housed in the outer rail, being slidable in a longitudinal direction of the outer rail;
    an inner rail housed in the middle rail, being slidable in a longitudinal direction of the middle rail; and
    a lever disposed between the outer rail and the middle rail, being slidable in the longitudinal direction of the outer rail, wherein
    the lever includes a lever projecting portion configured to lock sliding of the middle rail when the lever is drawn out by a predetermined distance, and
    the lever projecting portion of the lever drawn out by the predetermined distance is configured to lock sliding of the middle rail as being caught on a leading end of the middle rail.

13. The slide rail unit according to claim 12, wherein the lever is a leaf spring.

* * * * *